US009531529B1

(12) United States Patent
Gagnon et al.

(10) Patent No.: US 9,531,529 B1
(45) Date of Patent: Dec. 27, 2016

(54) SYSTEM AND METHOD FOR SADDLE POINT LOCKING DETECTION DURING CLOCK AND DATA RECOVERY

(71) Applicant: Cadence Design Systems, Inc., San Jose, CA (US)

(72) Inventors: Mathieu Gagnon, Verdun (CA); Jean-Francois Delage, Saint-Laurent (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/970,777

(22) Filed: Dec. 16, 2015

Related U.S. Application Data

(60) Provisional application No. 62/221,317, filed on Sep. 21, 2015.

(51) Int. Cl.
*H04L 7/04* (2006.01)
*H04B 1/06* (2006.01)
*H04L 7/033* (2006.01)

(52) U.S. Cl.
CPC . *H04L 7/04* (2013.01); *H04B 1/06* (2013.01); *H04L 7/033* (2013.01)

(58) Field of Classification Search
CPC ............ H04L 7/033; H04L 7/04; H03L 7/087; H04B 1/06
See application file for complete search history.

(56) References Cited

U.S. PATENT DOCUMENTS

| 5,487,066 A * | 1/1996 | McNamara ......... H04L 12/2801 370/410 |
| 7,127,022 B1 * | 10/2006 | Dieguez ................ H03L 7/0807 327/155 |
| 8,710,929 B1 | 4/2014 | Naviasky et al. |
| 8,737,491 B1 | 5/2014 | Wilson et al. |
| 2003/0091139 A1 * | 5/2003 | Cao ....................... H03D 13/003 375/376 |
| 2007/0075785 A1 * | 4/2007 | Kossel .................... H03L 7/089 331/16 |
| 2012/0109356 A1 * | 5/2012 | Kong ....................... H04L 7/033 700/121 |
| 2014/0062549 A1 * | 3/2014 | Navid .................... G11C 7/222 327/156 |

(Continued)

*Primary Examiner* — Jean B Corrielus
(74) *Attorney, Agent, or Firm* — Holland & Knight LLP; Mark H. Whittenberger, Esq.

(57) ABSTRACT

The present disclosure relates to a method and apparatus for detecting clock and data recovery loop saddle-point locking in an electronic circuit. Embodiments may include receiving a signal at a primary clock and data recovery ("CDR") loop associated with the electronic circuit and processing the signal using at least one of a first order CDR loop and a second order CDR loop included within the primary CDR loop. Embodiments may further include determining whether a fast-phase lock module is required, wherein determining includes determining two transitions in a sampling triplet. If it is determined that the fast-phase lock module is required, embodiments may include providing a trigger signal to the fast-phase lock module. Embodiments may further include receiving the trigger signal at the fast-phase lock module associated with the electronic circuit and performing a fast-phase lock operation on the signal.

20 Claims, 15 Drawing Sheets

(56) References Cited

U.S. PATENT DOCUMENTS

2015/0004919 A1* 1/2015 Ek .......................... H03L 7/087
                                                            455/75
2015/0092898 A1* 4/2015 Lee .................. G06Q 10/06312
                                                           375/354

* cited by examiner

SYSTEM AND METHOD FOR SADDLE POINT LOCKING DETECTION DURING CLOCK AND DATA RECOVERY

CROSS REFERENCE TO RELATED APPLICATIONS

This application claims the benefit of U.S. Provisional Application having Ser. No. 62/221,317, filed Sep. 21, 2015, the entire contents of which are incorporated herein by reference.

FIELD OF THE INVENTION

The present disclosure relates to Serializer/deserializer ("SerDes") components, and more specifically, to clock and data recovery ("CDR") techniques that may be used with these components.

DISCUSSION OF THE RELATED ART

SerDes components are becoming common on integrated System-on-a-chip ("SOC") and Application Specific Integrated Circuits ("ASICs"). The trend has involved increasing the number of serial links at higher and higher speeds in smaller geometry processes. This may be necessary in order to provide the data transmission requirements of higher capacity chips that are severely pin limited. A high speed serial link requires data and clock recovery for wired applications such as backplanes, networks and chip to chip communication. Some industry standards for this type of communication include but are not limited to, Peripheral Component Interconnect Express ("PCIe"), Common Electrical Interface ("CEI-6"), 10 Gigabit Attachment Unit Interface ("XAUI") (IEEE 802.3ae), Serial ATA ("SATA"), Fibrechannel, 802.3ap (e.g., 10GBASE-KR) and others. In this way, transfer data rates from 2.5 Gb/s, up to as high as 20 Gb/s are becoming common.

Many SerDes components include CDR units, which may include functional blocks configured to lock onto a stream of data to recover transmitted information. The incoming stream is typically sampled at twice the rate of the incoming baud rate. A CDR may align the phase and frequency of a local sampling clock such that sampling instants coincide with the edge and center of data bits being recovered. Accordingly, a CDR may act similarly to a servo-loop that captures the phase alignment error and tries to minimize it. Some CDR units may utilize data eye samplers and/or diagrams that may be used to depict the position of one or more data eyes of signal transitions, which may be expressed in amplitude versus time (e.g. in unit interval, or "UI", corresponding to a symbol period). The data eye may be generated as signals transition, wherein each transition may be referred to as a crossing point.

SUMMARY OF INVENTION

In an embodiment of the present disclosure a method for detecting clock and data recovery loop saddle-point locking in an electronic circuit is provided. The method may include receiving a signal at a primary clock and data recovery ("CDR") loop associated with the electronic circuit and processing the signal using at least one of a first order CDR loop and a second order CDR loop included within the primary CDR loop. Embodiments may further include determining whether a fast-phase lock module is required, wherein determining includes determining two transitions in a sampling triplet. If it is determined that the fast-phase lock module is required, embodiments may include providing a trigger signal to the fast-phase lock module. Embodiments may further include receiving the trigger signal at the fast-phase lock module associated with the electronic circuit and performing a fast-phase lock operation on the signal.

One or more of the following features may be included. In some embodiments, performing the fast-phase lock operation may further include selecting a phase correction direction configured to minimize a clock recovery error, or selecting an arbitrary direction if the clock recovery error is zero and applying a phase correction in the selected direction. The method may further include reducing a phase correction magnitude prior to selection and iteratively selecting, applying, and reducing with the reduced phase correction magnitude. In some embodiments the arbitrary direction may be selected for a first iteration. In some embodiments, no phase correction may be applied if a clock recovery error is determined to be zero after a first iteration.

The method may include selecting a phase correction direction includes evaluating over one or more samples with respect to their optimal location. The phase correction magnitude may be scaled by ½ after each iteration. The initial phase correction step magnitude may be ¼ of a baud UI. The fast-phase lock operation may include shifting the sampling phase by half of a baud UI. In some embodiments, shifting the sampling phase by half a baud UI may be performed by swapping the samples of the CDR taken in a center of an eye with those taken in the edge of the eye, while maintaining a proper ordering of the samples.

In another embodiment of the present disclosure an apparatus for detecting clock and data recovery loop saddle-point locking is provided. The apparatus may include an integrated circuit (IC) configured to receive a signal at a primary clock and data recovery ("CDR") loop associated with the electronic circuit and to process the signal using at least one of a first order CDR loop and a second order CDR loop included within the primary CDR loop. The IC may be further configured to determine whether a fast-phase lock module is required, wherein determining includes determining two transitions in a sampling triplet. In some embodiments, if it is determined that the fast-phase lock module is required, the IC may be further configured to provide a trigger signal to the fast-phase lock module. The IC may be further configured to receive the trigger signal at the fast-phase lock module associated with the electronic circuit and to perform a fast-phase lock operation on the signal.

One or more of the following features may be included. In some embodiments, the IC may be further configured to select a phase correction direction configured to minimize a clock recovery error, or select an arbitrary direction if the clock recovery error is zero. The IC may be further configured to apply a phase correction in the selected direction. The IC may be further configured to reduce a phase correction magnitude prior to selection and iteratively select, apply, and reduce with a reduced phase correction magnitude. The arbitrary direction may be selected for a first iteration. In some embodiments, no phase correction may be applied if a clock recovery error is determined to be zero after a first iteration.

In some embodiments, selecting a phase correction direction may include evaluating over one or more samples with respect to their optimal location. The phase correction magnitude may be scaled by ½ after each iteration. The initial phase correction magnitude may be ¼ of a baud UI. The fast-phase lock operation may include shifting the sampling phase by half of a baud UI. In some embodiments, shifting the sampling phase by half a baud UI may be performed by swapping the samples of the CDR taken in a center of an eye with those taken in the edge of the eye, while maintaining a proper ordering of the samples.

Additional features and advantages of embodiments of the present disclosure may be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE EMBODIMENTS

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The present disclosure generally relates to systems and methods for clock and data recovery. More specifically, systems and methods that may detect and avoid saddle point locking events associated with CDR are provided.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. The term "module" may include, for example, hardware or software or combinations thereof that may be configured to perform an operation.

Figure 1:
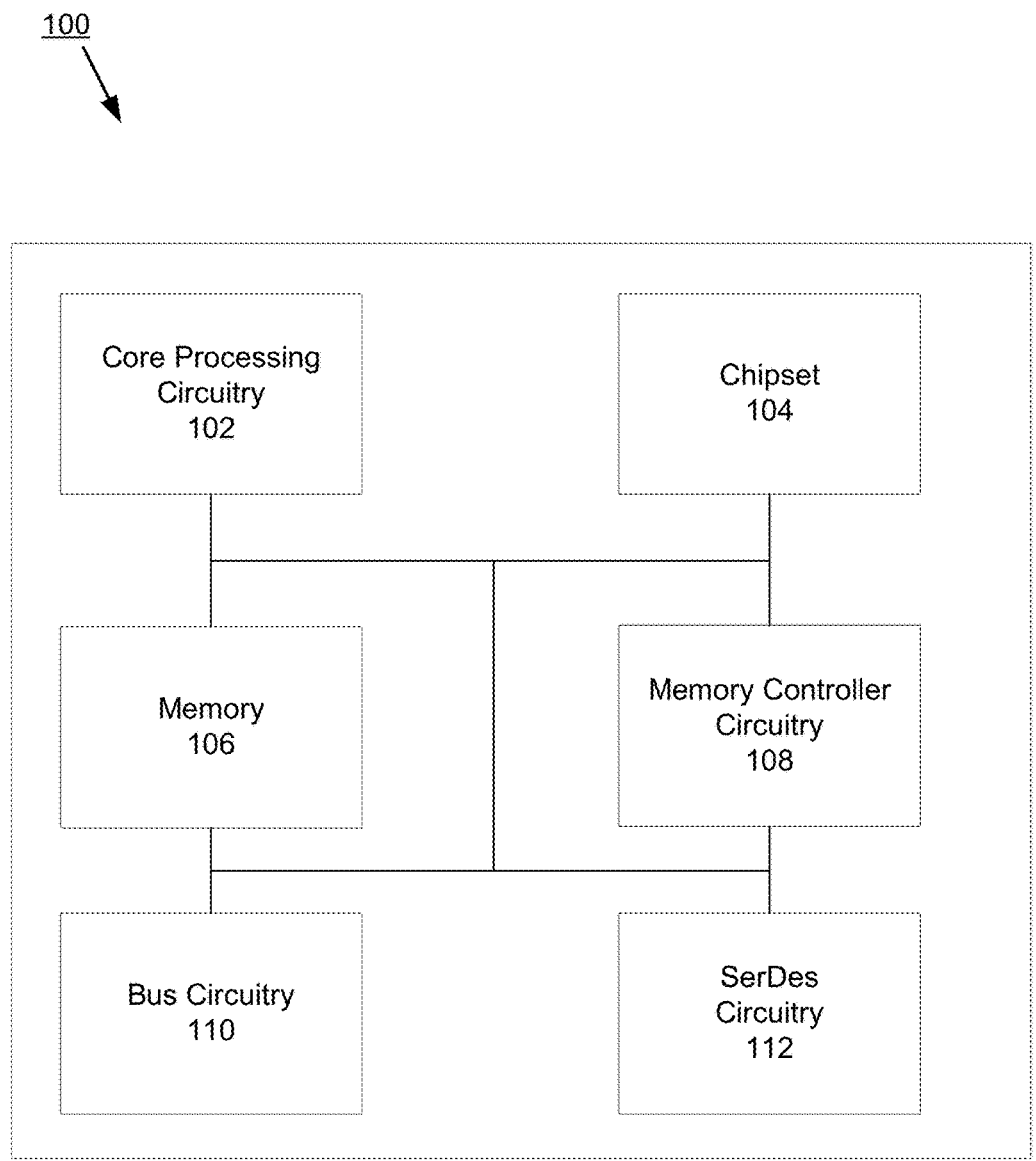
FIG. 1 is a diagram depicting an embodiment incorporating CDR saddle point detection in accordance with the present disclosure.

Referring now to FIG. 1, an exemplary embodiment of an integrated circuit (IC) 100 in accordance with the present disclosure is shown. The term "integrated circuit", as used in any embodiment herein, may refer to a semiconductor device and/or microelectronic device, such as, for example, but not limited to, a semiconductor integrated circuit chip. The specific configuration, arrangement, and components shown in IC 100 are provided merely for exemplary purposes as additional and/or alternative configurations are also within the scope of the present disclosure.

In some embodiments, IC 100 may include core processing circuitry 102, which may include any suitable processors, e.g., an Intel® Pentium® processor. Of course, many other processors may be used without departing from the scope of the present disclosure. IC 100 may also include chipset 104. In some embodiments, chipset 104 may include both Northbridge/memory controller hub (MCH) and Southbridge/I/O controller hub (ICH) circuitry. These components may be included within chipset 104 or at any other location within IC 100. IC 100 may also include memory 106, which may be in communication with core processing circuitry 102. Memory 106 may comprise one or more of the following types of memories: semiconductor firmware memory, programmable memory, non-volatile memory, read only memory, electrically programmable memory, random access memory, flash memory (which may include, for example, NAND or NOR type memory structures), magnetic disk memory, and/or optical disk memory. Either additionally or alternatively, memory may comprise other and/or later-developed types of computer-readable memory. IC 100 may additionally include memory controller circuitry 108 configured to manage the flow of data to and from memory. IC 100 may further include bus circuitry 110 configured to provide compatibility with a variety of different bus architectures, including, but not limited to, Universal Serial Bus (USB), Serial Advanced Technology Attachment (SATA), Peripheral Component Interface (PCI), PCI-Express and System Management Bus (SMBus).

IC 100 may also include SerDes circuitry 112, which may include numerous components configured to transceive one or more high-speed data streams. Some particular examples of the structure and operations of SerDes circuitry 112 are discussed in further detail hereinbelow.

Figure 2:
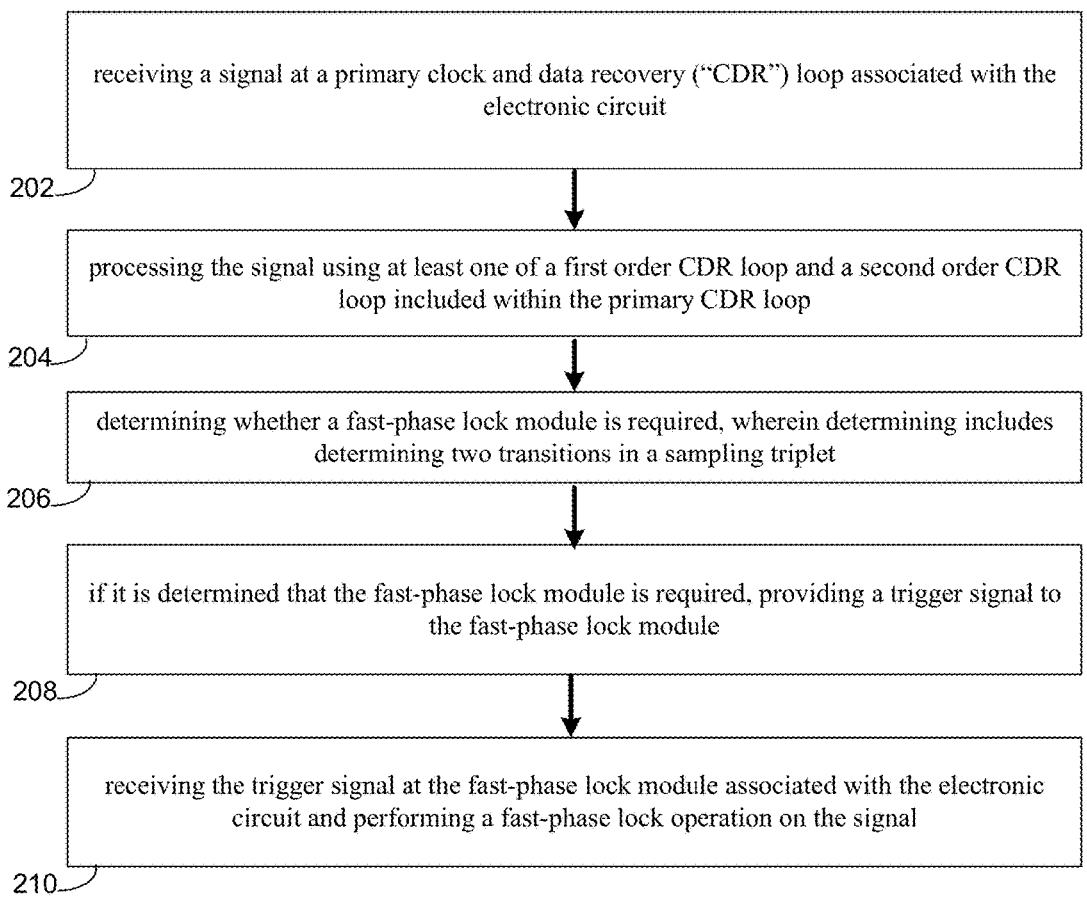
FIG. 2 is a flowchart depicting operations consistent with an embodiment incorporating CDR saddle point detection in accordance with the present disclosure.
Figure 3A:
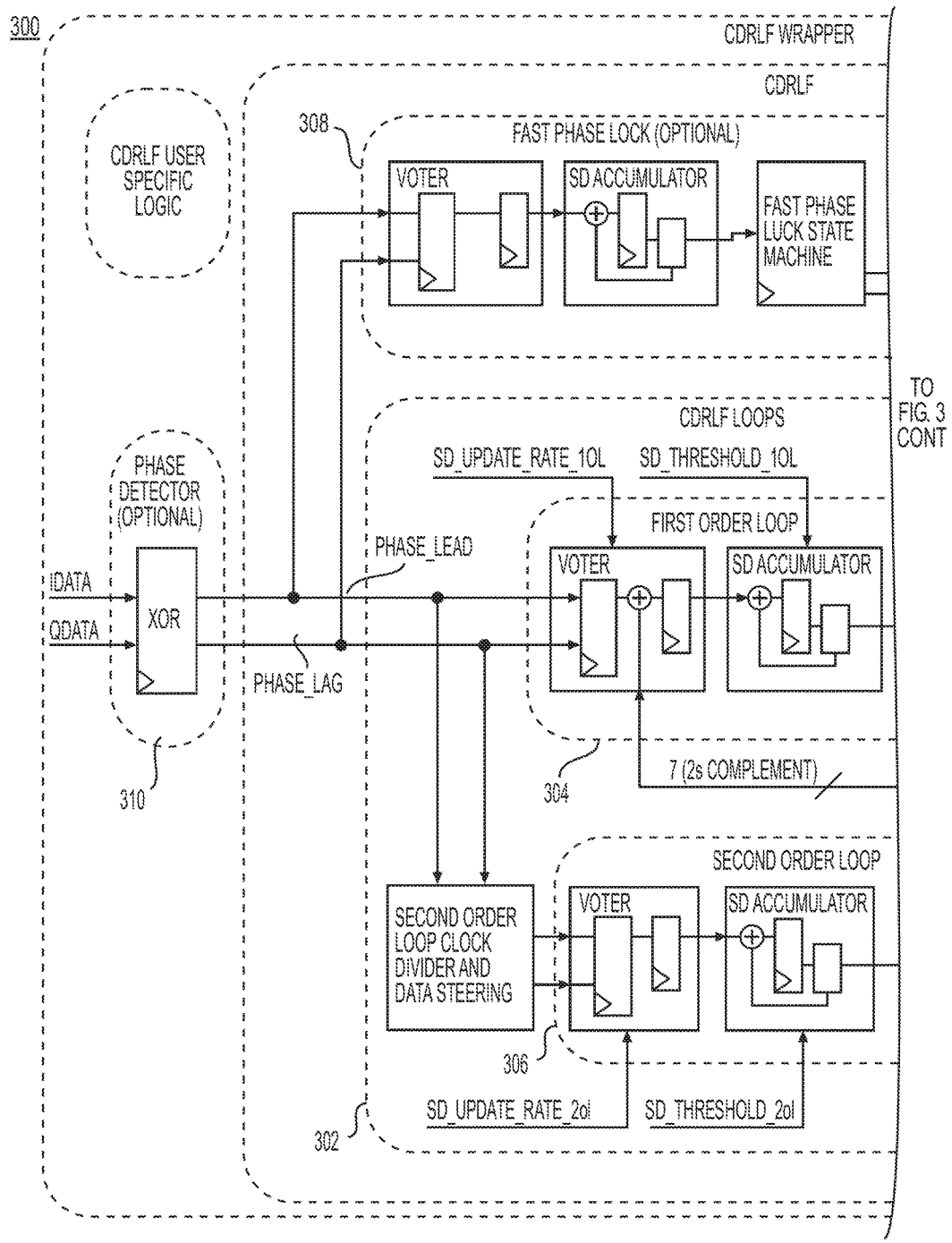
FIGS. 3A and 3B are diagrams depicting an embodiment incorporating CDR saddle point detection in accordance with the present disclosure.
Figure 3B:
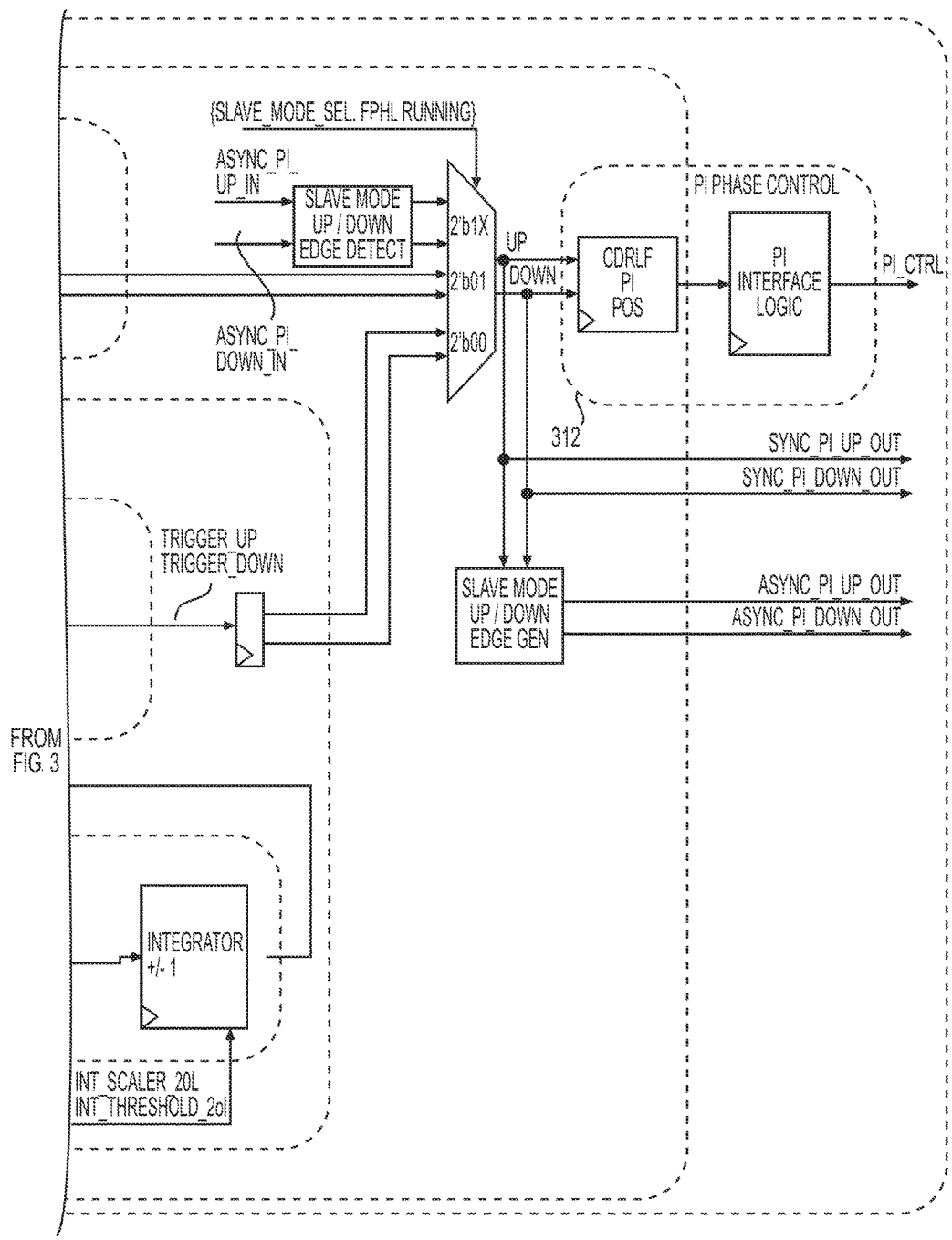

Referring now to FIGS. 2, 3A and 3B, embodiments consistent with the saddle point detection process are provided. FIG. 2 includes a flowchart 200 depicting a saddle point locking detection process consistent with embodiments of the present disclosure. As will be discussed in further detail hereinbelow, the saddle point detection process described herein may include receiving (202) a signal at a primary clock and data recovery ("CDR") loop associated with the electronic circuit and processing (204) the signal using at least one of a first order CDR loop and a second order CDR loop included within the primary CDR loop. Embodiments may further include determining (206) whether a fast-phase lock module is required, wherein determining includes determining two transitions in a sampling triplet. If it is determined that the fast-phase lock module is required, embodiments may include providing (208) a trigger signal to the fast-phase lock module. Embodiments may further include receiving (210) the trigger signal at the fast-phase lock module associated with the electronic circuit and performing a fast-phase lock operation on the signal. Numerous other operations are also within the scope of the present disclosure.

In some embodiments, CDR units, such as those shown in FIGS. 3A and 3B, may operate as functional blocks configured to lock onto a stream of data to recover transmitted information. FIGS. 3A and 3B depicts a CDR system 300 including numerous components, some of which may include, but are not limited to a primary CDR loop 302 having a first order loop 304 and second order loop 306. CDR system 300 also includes fast phase lock circuitry 308, phase detector circuitry 310, and phase interpolator ("PI") circuitry 312. These are each discussed in further detail hereinbelow. Additional information regarding examples of CDR systems may be available in U.S. Pat. Nos. 8,737,491 and 8,710,929 which are herein incorporated by reference in its entirety.

In some embodiments, the incoming stream associated with saddle point detection process may be sampled at twice the rate of the incoming baud rate. Additionally and/or alternatively, embodiments included herein may assume an open eye at the CDR input. Such an open eye system generally refers to one for which there exists some portion of the eye that may be sampled to recover the value of the baud transmitted without relying on past or future bits.

In some embodiments, one or more CDR loops may be configured to align the phase and frequency of a local sampling clock such that sampling instants coincide with the edge and center of data bits being recovered. In this way, a CDR loop may operate similar to a servo-loop that captures the phase alignment error and attempts to minimize it.

Figure 4:
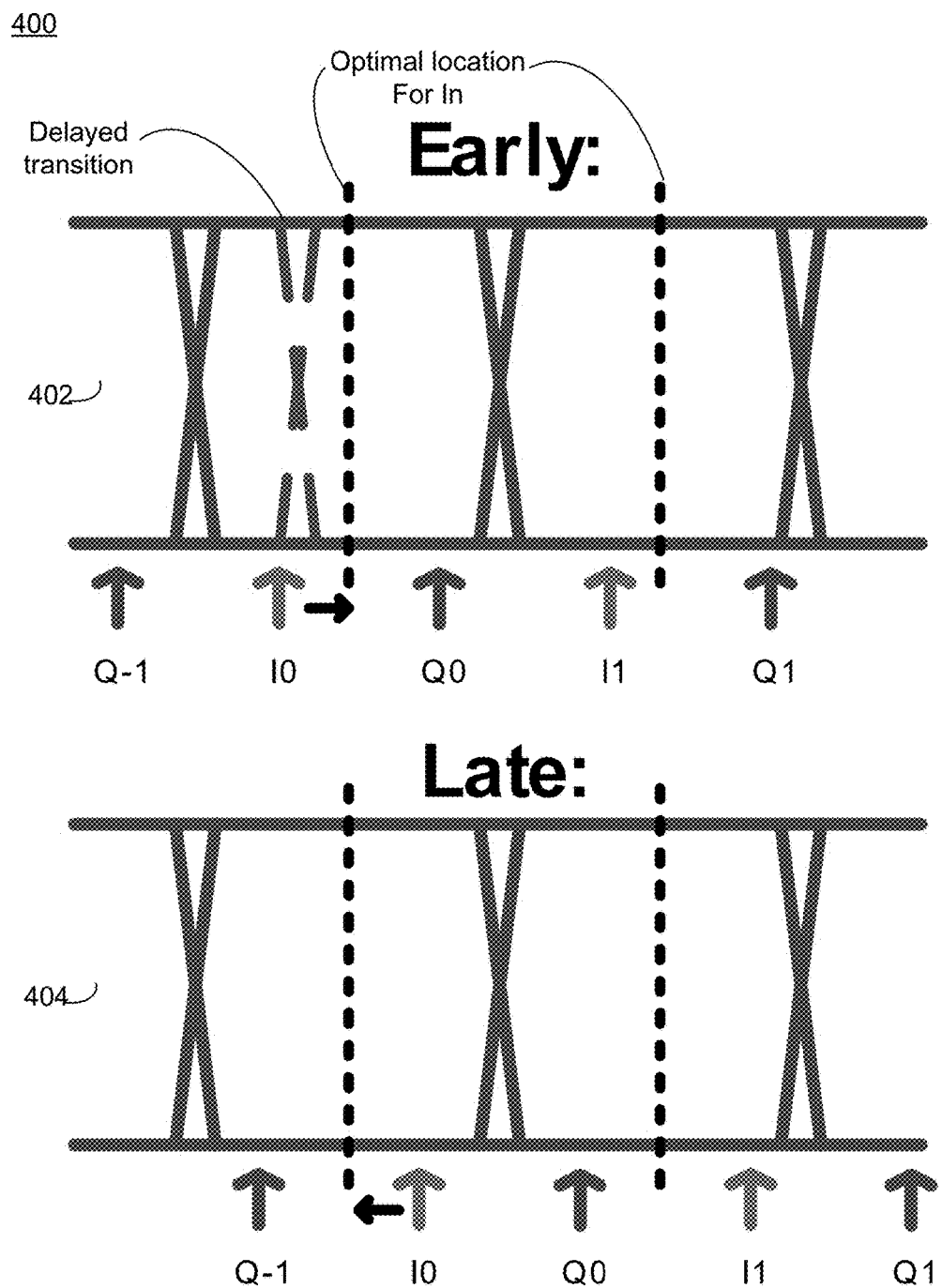
FIG. 4 is a diagram depicting an embodiment incorporating CDR saddle point detection in accordance with the present disclosure.

Referring also to FIG. 4, an example CDR having two samples per baud labeled "In" and "Qn" is provided (e.g. in-phase and quadrature signals). In this example, it may be desirable to have the In samples to recover the data within the baud with maximum tolerance to input jitter. FIG. 4 illustrates an example where the sampling clock is early or late with respect to incoming data. Accordingly, the terms "early" and "late" as used herein, may correspond to these situations respectively. As discussed above, embodiments included herein assume an open-eye system and optimal baud sampling locations are indicated by the dark dotted line, centered between baud transitions.

In the example shown in FIG. 4, assume the arrows associated with the I samples should align with the center of a data bit. In the first diagram 402, I samples are sampled too early. In the presence of jitter, receiving an incorrect sample is more likely. Such an incorrect sample could arise if the transition was delayed, as shown by the dashed gray lines in FIG. 4, as the previous baud would get sampled twice. In the second diagram 404, I samples are sampled too late, but the impact on jitter tolerance is identical. The difference between the optimal sampling point and the actual sampling point is the alignment error. In some instances, CDRs may not directly align the In samples. In contrast, CDRs may be configured to align the Qn samples to the average edge of the eye, and then have a fixed delay to generate the In samples. In these embodiments, it is assumed that the optimal location for In (e.g., represented by the black dashed lines in the previous figure) may be reached when Qn is aligned on the average transition between samples. Since there may be only two samples per unit interval ("UI"), the magnitude of the alignment error may be unknown. The system may only recognize if it samples earlier or later than what is optimal.

In some embodiments of saddle point detection process, proper alignment may be determined by analyzing triplets of samples, and detecting trends. For example, when I0==Q0 and Q0≠I1, sampling is likely too early. Saddle point detection process may then record one more hit for an early sampling trend. When this trend is confirmed, the clock sampling instants should move right. In contrast, when I0≠Q0 and Q0==I1, sampling is likely too late. Saddle point detection process may be configured to record one more hit for a late sampling trend. When this trend is confirmed, the clock sampling instants should move left. When I0==Q0==I1, there are no transitions, therefore no information to act upon. This situation may be referred to as a "null" indication hereinbelow, meaning a condition where neither a "late" or and "early" indication can be generated by this type of phase detection circuit.

In some embodiments, a phase detector ("PD") block (e.g. phase detector 310 shown in FIG. 3) may be configured to output the early and late indications from the incoming I and Q samples. Saddle point detection process may then average these outputs and move the sampling points in accordance.

Figure 5:
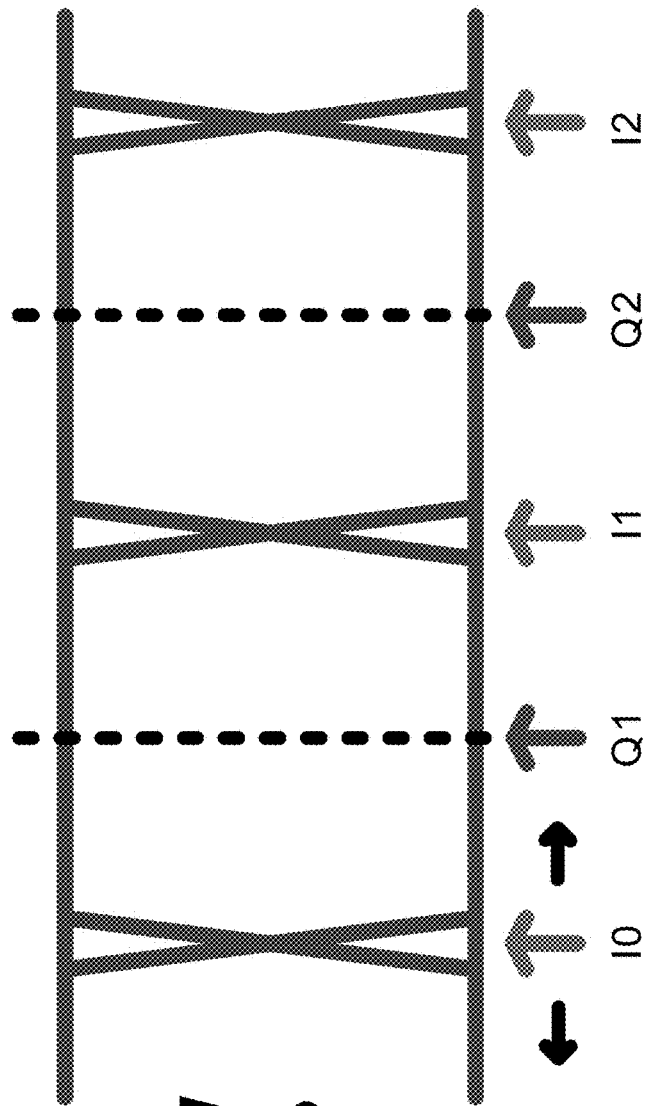
FIG. 5 is a diagram depicting an embodiment incorporating CDR saddle point detection in accordance with the present disclosure.

In some embodiments, by averaging the number of times the system has identified Early vs. Late cases, a CDR process may then determine if it should move the sampling points towards the left or the right. An extreme case of phase alignment may occur when I and Q sampling points are swapped (e.g., 180° out of phase), as is shown in FIG. 5. This particular situation is referred to as the saddle point. The saddle point is considered "metastable" and is divergent. Note that in this case, there is no significant indication of whether the sampling point is either late or early, since it is equally far from an optimal point in either directions. On average, such a condition could generate an equal number of early and late indications, similar to the case where the sampling point is locked on the optimal point (I samples in the center of the eye, Q samples on the edges). For example, as soon as the sampling point moves sufficiently away from the saddle point in either direction (earlier or later), the system will move away and converge until the phase settles near the ideal sampling point (e.g., I samples in the middle, Q samples on the edge). However, when the I sampling point stays very near this saddle point, a clear direction may be difficult to determine since noise, jitter and other signal impairments may cause the average of Early and Late events to be close to 0. Duty cycle distortion ("DCD") may be particularly bad as it may be a completely deterministic source of jitter that may create an equal amount of Early/Late outcomes for alignments near the 180° phase shift. These situations effectively reduce the gain of the clock recovery loop and prevent it from getting out of the saddle point rapidly.

Figure 6:
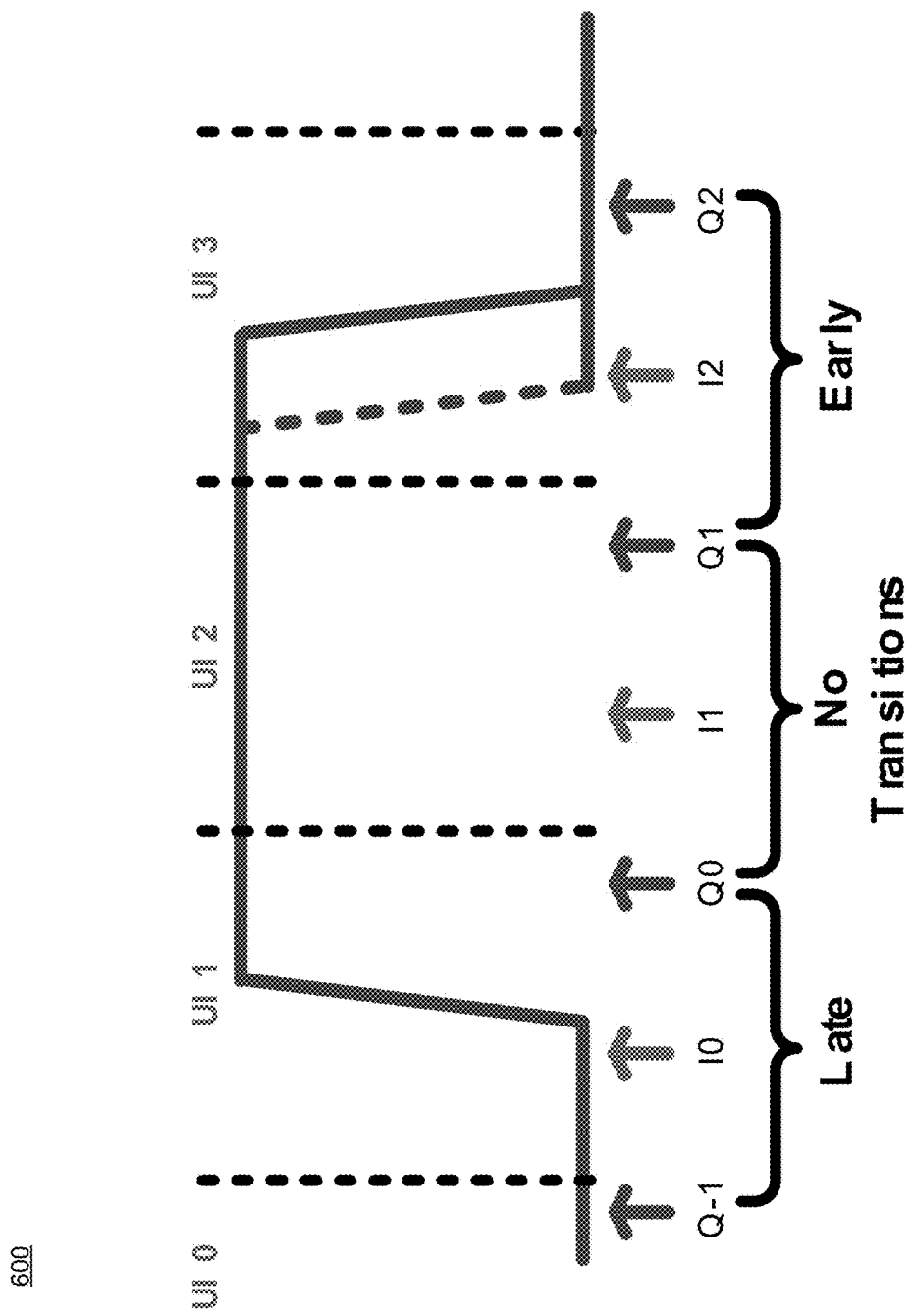
FIG. 6 is a diagram depicting an embodiment incorporating CDR saddle point detection in accordance with the present disclosure.

Referring now to FIG. 6, a diagram 600 is provided that shows how jitter or noise on a signal's edge may lead to experiencing both Early and Late cases. In this particular example, the falling edge in UI 3 is pulled towards the left due to noise. The presence of both Early and Late cases may result in CDR indecisiveness, which may last for a prolonged period of time. CDR lock time may become a random function of noise magnitude and distribution, as well as other parameters affecting the effective CDR loop gain.

Figure 7:
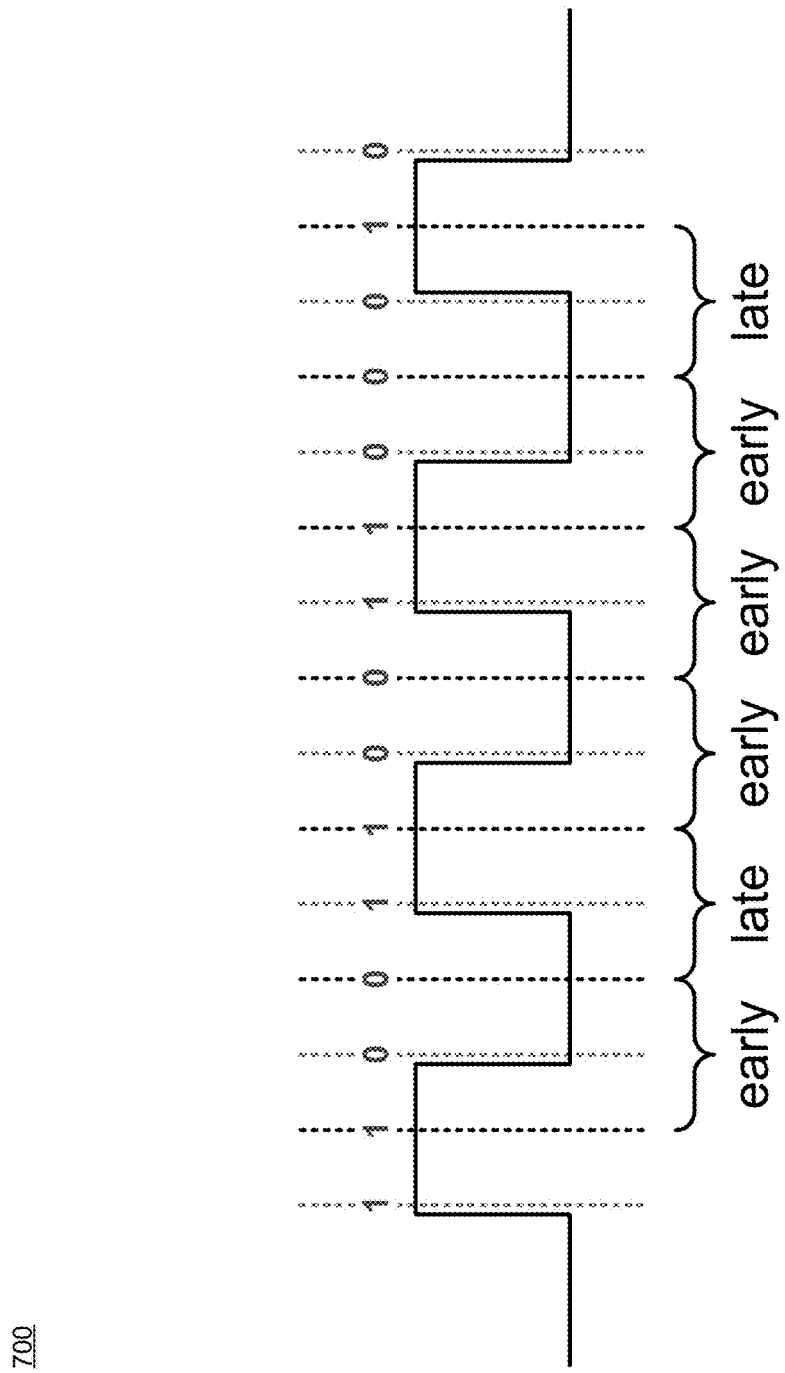
FIG. 7 is a diagram depicting an embodiment incorporating CDR saddle point detection in accordance with the present disclosure.

In some cases, DCD and/or jitter may repeatedly incur balanced Early/Late outcomes and effectively lock the CDR on the saddle point. FIG. 7 illustrates how DCD may cause a CDR system to produce as many Early as Late outcomes, provided it is aligned on the saddle point.

For certain protocols, especially burst-mode protocols such as passive optical networks ("PON"), lock-time is an important aspect of data transmission efficiency, because the CDR may need to re-acquire a lock at every packet being sent. Additionally and/or alternatively, upstream packets may have different originators (e.g., customer premises equipment), which may cause data streams to arrive at various phase alignments. The more time required to lock, the less time there may be to transmit the payload. For example, 10G Ethernet PON ("EPON") mandates that a CDR acquire a lock within 400 ns at most. More stringent requirements are often desired to have a competitive product. A CDR loop stuck on its saddle point may violate lock-time requirements. Accordingly, embodiments of saddle point locking detection process may be configured to detect and rectify a CDR loop saddle point locking event.

Referring again to FIG. 3, an embodiment of SerDes circuitry 300 depicting a primary clock and data recovery loop 302 is provided. In some embodiments, it should be noted that the incoming stream may be sampled at twice the rate of the incoming baud rate. Additionally and/or alternatively, and as discussed above, embodiments included herein may assume an open eye at the CDR input.

In some embodiments, primary clock and data recovery loop 302 may include first order loop 304 and second order loop 306. In some embodiments, first order loop 304 may be configured to track fast changes in the incoming signal's phase (e.g., jitter). Second order loop 306 may be configured to better track frequency offsets that may exist between the local and far end clocks. While first order loop 304 may achieve frequency tracking, it may do so at the expense of lower jitter tolerance because a static error of the positioning within the eye results from tracking this offset. Accordingly, second order loop 306 may be configured to address this issue as this error may be mathematically integrated (e.g., memorized) as the frequency offset is cancelled.

In some embodiments, SerDes circuitry 300 may further include fast phase lock circuitry 308, which may be configured to accelerate the acquisition of a valid CDR lock point while in presence of signal impairments (e.g., noise) that degrade CDR loop gain. Fast-phase-lock circuitry 308 may operate as a bisection engine operating in N steps. For example, N may be set by the required accuracy of the system and may be limited by its phase locking granularity.

For example, for N=3, fast-phase-lock circuitry 308 may operate in the following manner:
  Step 0: receive a signal to start the fast-locking sequence.
  Step 1: accumulate the difference between Early vs. Late indications for a certain time duration, and then perform a ¼ UI phase jump in the direction that minimizes this difference. If the difference is null, the algorithm selects an arbitrary direction.
  Step 2: repeat step 1 with a ⅛ UI phase jump.
  Step 3: repeat step 1 with a 1/16 UI phase jump.
  Return control to the base CDR engine.

It should be noted that the first step of ¼ UI is such that it may be half the worst-case alignment of the saddle point. Assuming that all the steps are taken are in the right direction (or any direction if we start on the saddle point, but we force a movement), this equalizes the convergence time whether it starts from the optimal point (e.g., center of the eye) or the worst-case point (e.g., saddle point).

In some embodiments, fast-phase-lock circuitry 308 may be used to achieve relatively low lock times. Some protocols mandate low lock times which, in the presence of noise or other signal impairments, cannot be guaranteed through the classical two-loop-only approach. However, an external trigger signal may be required to activate the fast-phase-lock procedure. Some protocols such as EPON do not provide such an external trigger. Accordingly, embodiments of the saddle point detection process described herein may provide a means to detect a condition where fast-phase-lock is needed and therefore provide such a trigger signal.

Accordingly, embodiments of saddle point detection process may be configured to monitor the occurrence of one or more transitions on any I-Q-I triplet as an indication of saddle-point locking in the CDR loop. In some embodiments, the occurrence of two transitions may be particularly informative. In this way, saddle point detection process may move the CDR phase when this condition is detected through a mechanism such as the fast-phase-lock circuitry 308 shown in FIG. 3 and discussed above. The teachings of the present disclosure may be particularly effective for clock-like data patterns. Protocols that require fast lock acquisition times often use a clock-like data pattern as a preamble to train the CDR loop (e.g., alternating ones and zeros). Clock-like patterns provide transitions at every unit interval, therefore maximizing the amount of alignment information to use.

Figure 8:
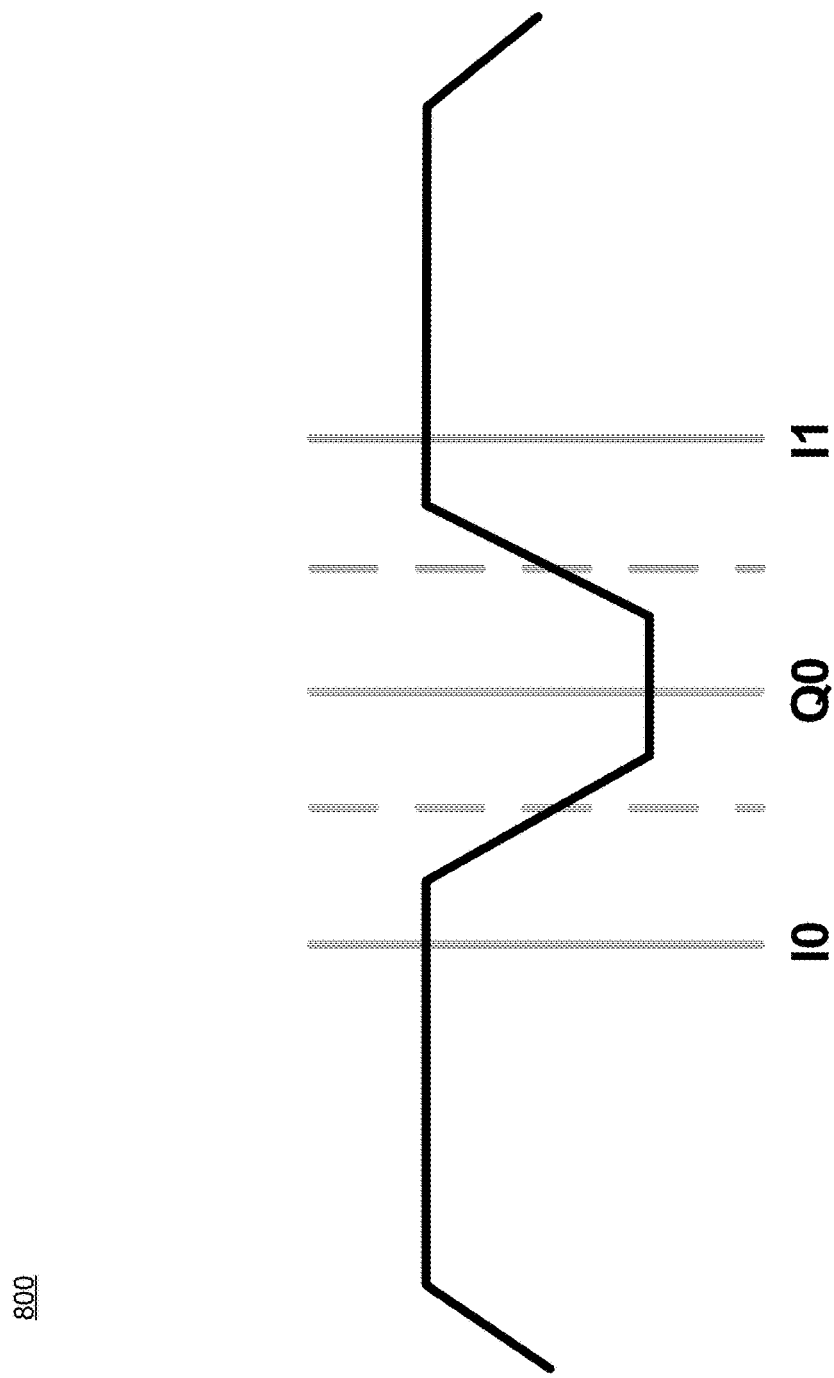
FIG. 8 is a diagram depicting an embodiment incorporating CDR saddle point detection in accordance with the present disclosure.

Referring now to FIG. 8, an embodiment illustrating the impact of DCD on a clock-like signal (e.g., instants I0 and I1 are separated by 1 UI) is provided. In this particular example, the misalignment is complete (e.g., 180 degrees). The dotted lines may represent actual signal zero-crossing instants whereas the full lines are aligned with the I sampling instants and represent where these crossings would fall without DCD for this particular alignment. In this particular example, there are two transitions in the I0-Q0-I1 triplet since I0≠Q0 and Q0≠I1.

Figure 9:
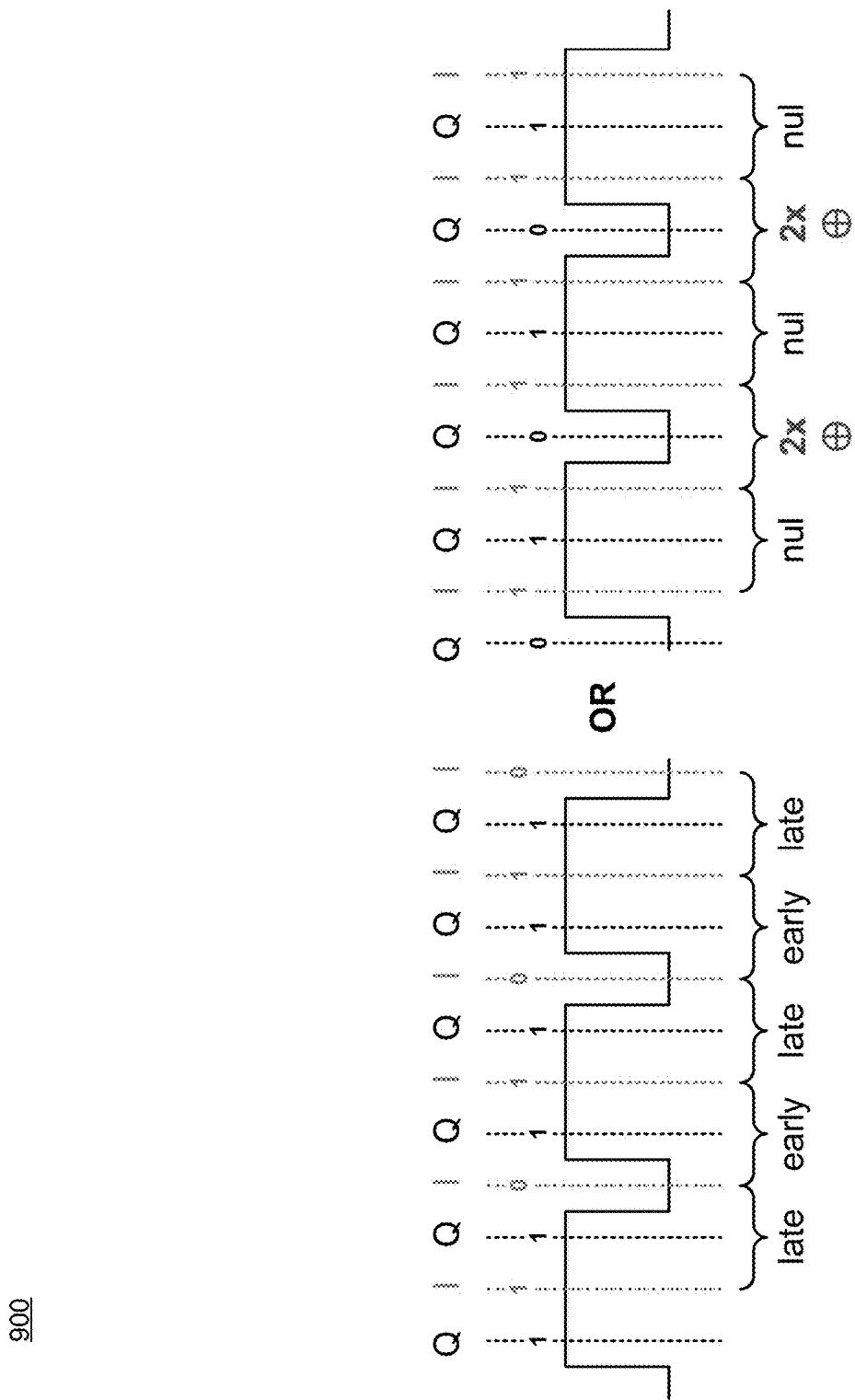
FIG. 9 is a diagram depicting an embodiment incorporating CDR saddle point detection in accordance with the present disclosure.

Referring also to FIG. 9, an embodiment showing that double-transitions may only occur when the sampling clock is close to 180 degrees out of phase with the incoming data is provided. For example, when In and Qn samples are inverted.

In some embodiments, saddle point detection process may determine that the samples are approximately 180° out of phase. When sampling close to 180 degrees out of phase, there are multiple possible generic scenarios. In a first scenario, the alignment and noise may be such that, on average, the number of early and late indications may be nearly equal. This may be indicative of saddle-point locking, resulting in long (or infinite) CDR recovery times. It should be noted that this scenario may require a nearly equal number of early and late indications, on average. In a second scenario, the alignment and noise may be such that one type of CDR indication is produced (e.g., either Early or Late). The CDR may diverge from the saddle point and lock quickly onto the right data.

In some embodiments, saddle point detection process may determine that the samples are approximately 0° out of phase with respect to a given reference point. If saddle point detection process determines that the sampling is not close to 180 degrees out of phase, the process may not detect out-of-lock conditions. Again, this assumes the eye is open, as with closed eyes, the region where on average Earlys and Lates cancel one another out may be wider.

In the saddle-point locking scenario described above, and in order to produce an equal number of Early and Late CDR phase detector outputs, the phase detector (e.g. PD 310) may alternate between generating Earlys and generating Lates. It should be noted that with a clock-like data pattern, nulls cannot occur indefinitely. This implies there may be variations in the CDR phase detector outputs, for example, Earlys and Lates. For a clock-like data pattern, these PD output variations occur frequently and each transition between an Early output and a Late output may imply that two transitions occurred during the same UI. This would not be guaranteed for a different pattern.

Figure 10:
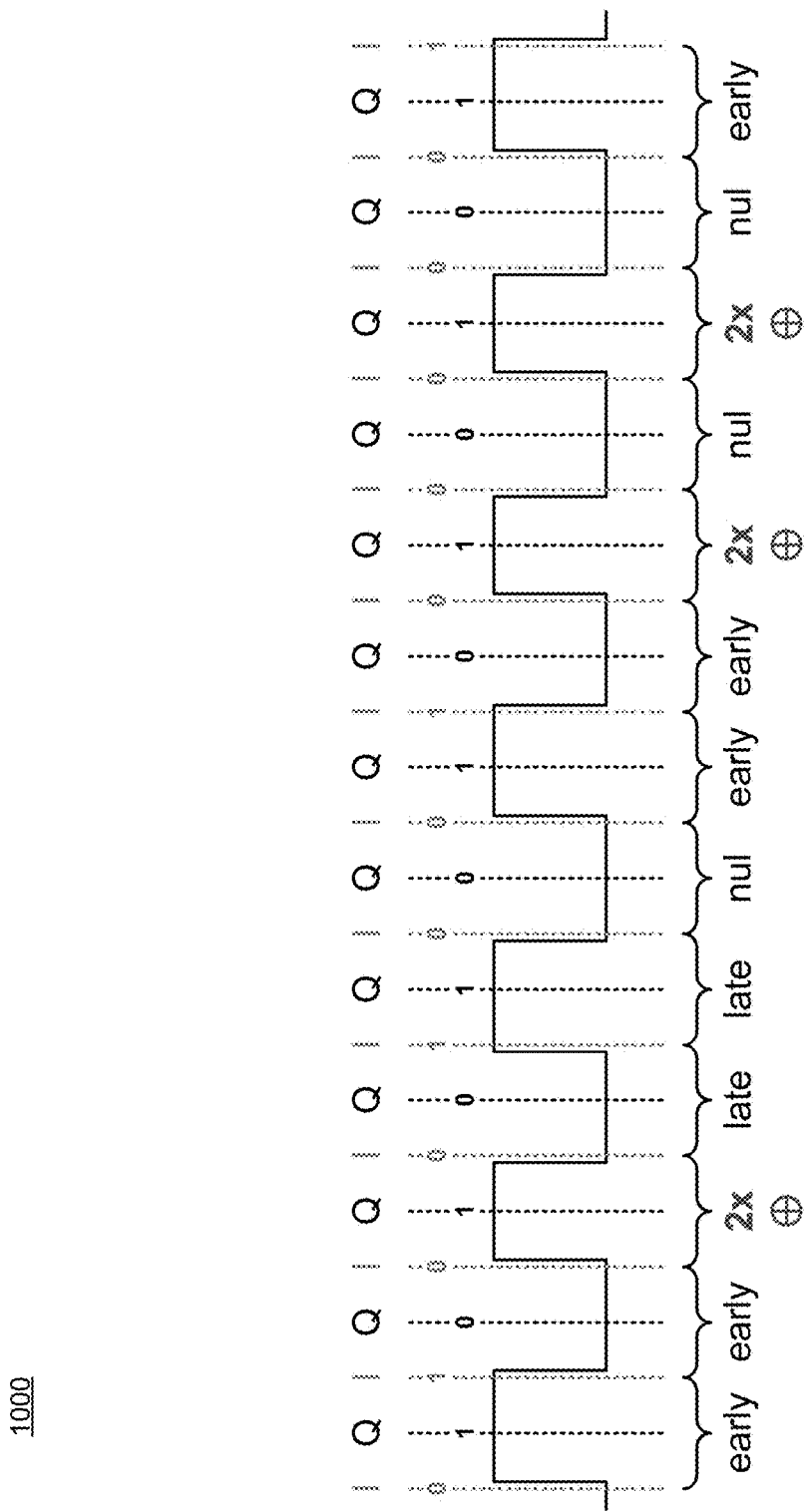
FIG. 10 is a diagram depicting an embodiment incorporating CDR saddle point detection in accordance with the present disclosure.

In some embodiments, there are other conditions that may also lead to a double transition per UI on a clock pattern as is shown in FIG. 10. Sequences of 'Early'→'Late', 'Early'→'Nul' and 'Nul'→'Nul' transitions may cause double crossings over I-Q-I triplets. This further helps the effectiveness of the saddle point detection process described herein.

Figure 11:
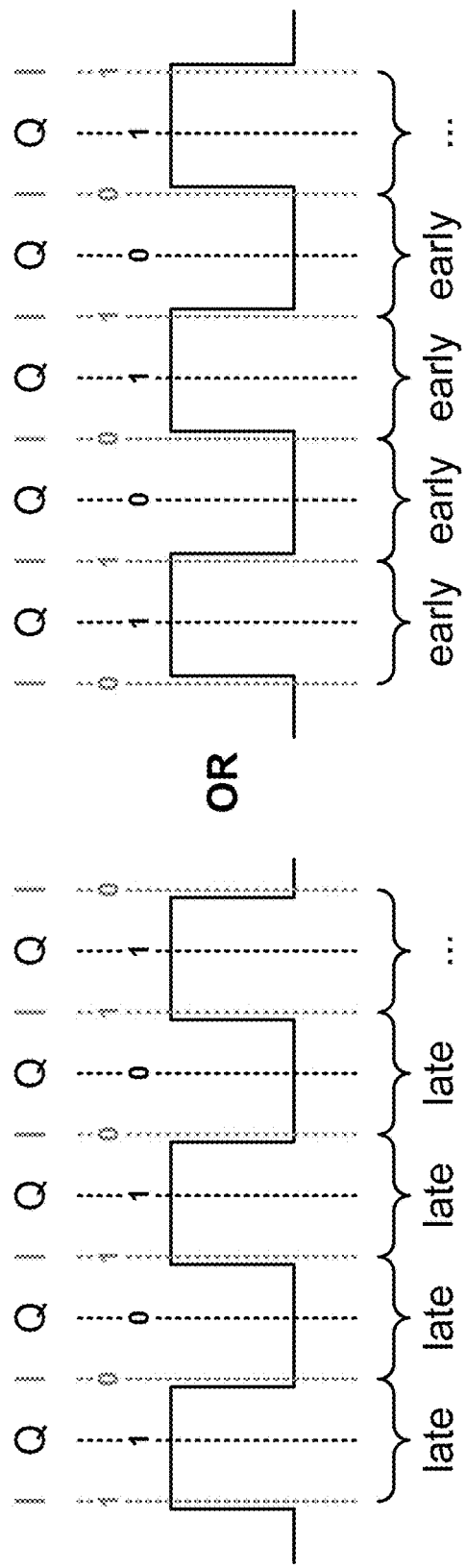
FIG. 11 is a diagram depicting an embodiment incorporating CDR saddle point detection in accordance with the present disclosure.

Referring now to FIG. 11, as discussed above, in a second scenario the CDR may be divergent. When only getting Earlys or Lates, no double signal transitions are detected. The CDR phase may be pushed in the same direction, thus quickly evading saddle-point metastability. This may be true even when the CDR alignment is initially approximately 180 degress away from the optimal, without significant DCD or jitter.

Figure 12:
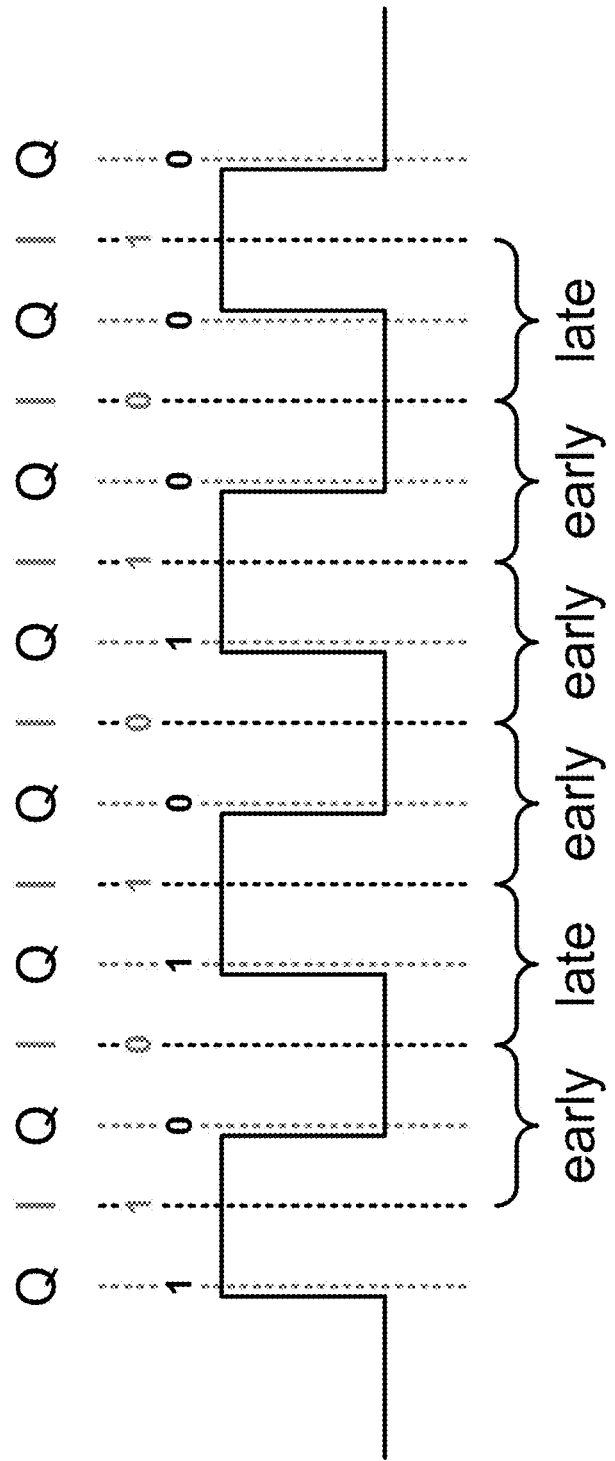
FIG. 12 is a diagram depicting an embodiment incorporating CDR saddle point detection in accordance with the present disclosure.

Referring also to FIG. 12, in some embodiments the CDR alignment may not be close to 180 degrees. Correct clock alignments do not produce double signal transitions over I-Q-I triplets, even with noise or DCD. Only one transition is expected, and should be aligned with Q. Amounts of jitter that make two transitions possible in this situation would result in a closed eye. The example shown in FIG. 12 depicts 'Early'→'Late' transitions, and yet there are no double edges over I-Q-I triplets.

Figure 13:
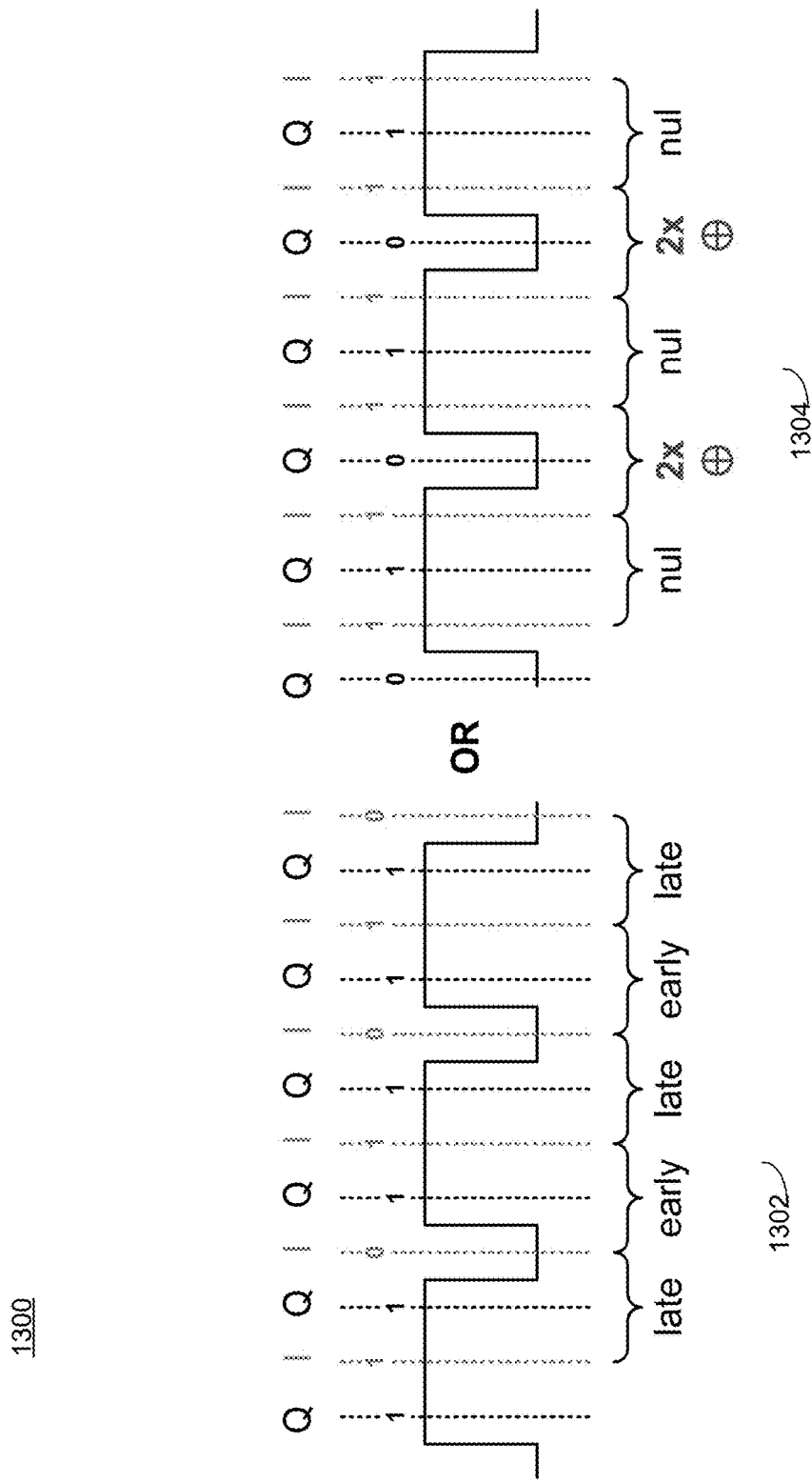
FIG. 13 is a diagram depicting an embodiment incorporating CDR saddle point detection in accordance with the present disclosure.

It should be noted that embodiments of saddle point detection process presented herein are effective in the presence of high duty-cycle distortion (DCD). Referring now to FIG. 13, an example diagram 1302 shows 'Early'→'Late' transitions, but no double edges over I-Q-I triplets. The alignment is however close to its optimal solution, and the circuit is not metastable. In contrast, example diagram 1304 shows 180 degree misalignment, resulting in two signal transitions during a single I-Q-I triplet.

Embodiments of saddle point detection process may include an approach for rapidly shifting the sampling phase out of the region of metastability as well as techniques for enabling autonomous out-of-lock detection and phase correction. The teachings of the present disclosure may be used in any suitable environment, including, but not limited to, burst mode contexts so as to speed up the lock process.

Figure 14:
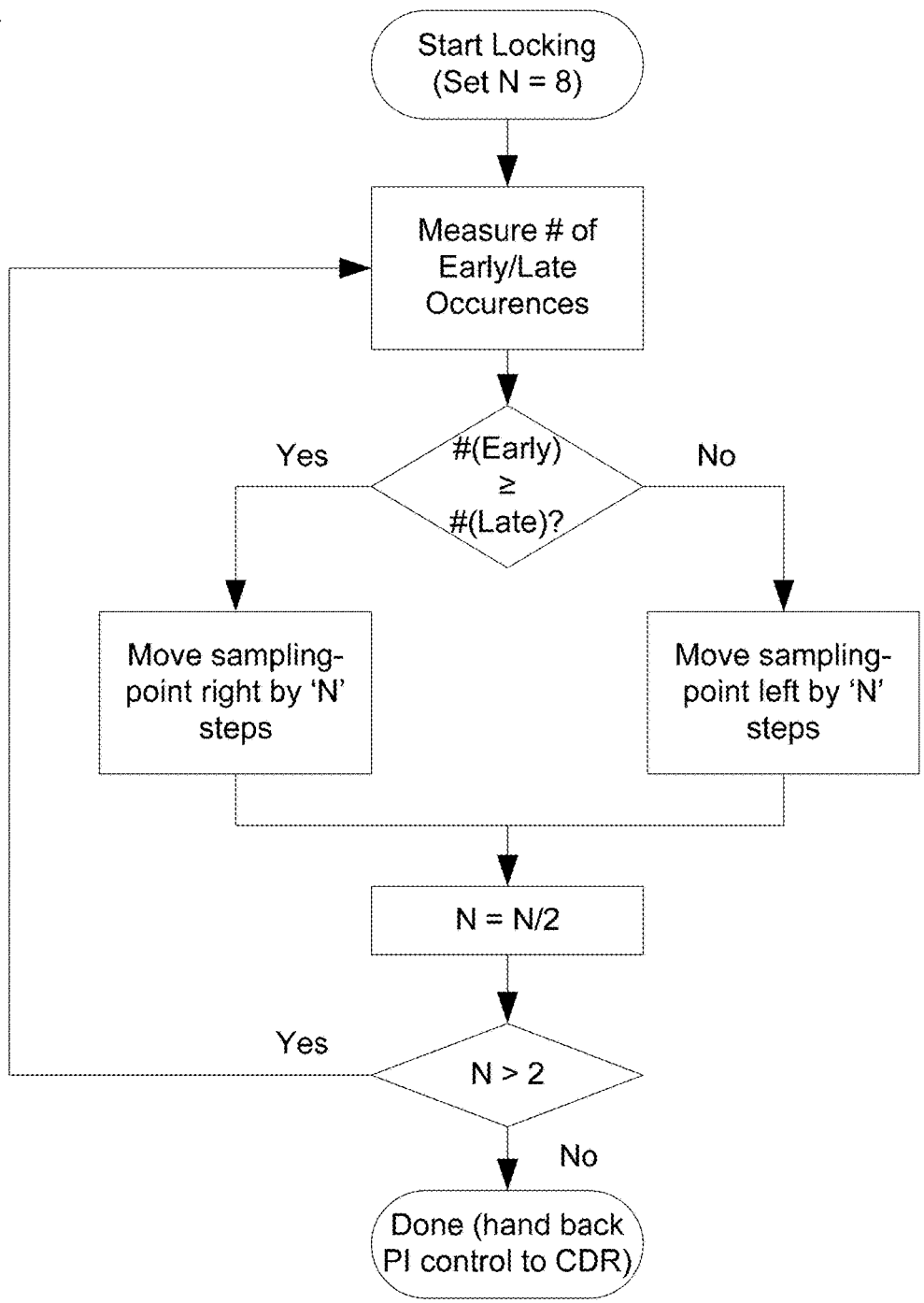
FIG. 14 is a diagram depicting an embodiment incorporating CDR saddle point detection in accordance with the present disclosure.

Referring now to FIG. 14, an embodiment showing an example of a rapid phase adjustment technique is provided. As discussed above, triggering fast-phase lock circuitry 308 may require knowledge of whether the CDR is out of lock or not. In some embodiments, a sampling clock may occupy one out of 32 phase positions within a UI. Fast phase lock circuitry 308 may include a bisection algorithm that allows rapid convergence towards a lock point by stepping through some of these positions to assess which is best. In the example of FIG. 14, at the end of the run, the phase will have shifted by 14 (out of 32) steps at most, which represents approximately 160° in phase shift.

As discussed above, in some embodiments, saddle point detection process may include performing a fast-phase lock operation. This may include selecting a phase correction direction configured to minimize a clock recovery error and/or selecting an arbitrary direction if the clock recovery error is zero. This may be followed up by applying a phase correction in the selected direction. In some cases, the selection of an arbitrary direction may be performed in any suitable manner. For example, this may occur automatically, in all cases, and/or if there is a tie between early and late indications. In some cases, the fast-phase lock operation may be performed iteratively, for example, by selecting a phase correction direction that minimizes the clock recovery error, or selecting an arbitrary direction if the error is zero, applying a phase correction in the selected direction and repeating one or more of these operations with the reduced phase correction magnitude. The arbitrary direction may be selected for a first iteration. In some embodiments, no phase correction may be applied if a clock recovery error is determined to be zero after a first iteration. In some cases the arbitrary direction is always selected for the first iteration. Additionally and/or alternatively, the arbitrary direction may only be selected for the first iteration. In some embodiments, selecting a phase correction may include evaluating over a number of samples whether the sampling points are on average late or early vs. their optimal location. In some particular embodiments, the phase correction magnitude may be scaled by ½ after each iteration.

As discussed above, saddle point detection process may be configured to detect double transitions in an I-Q-I triplet as a mechanism for detecting saddle-point locking in a CDR loop. Embodiments of the present disclosure may be used in any suitable manner and may be particularly efficient when applied to a clock pattern. Once detected, saddle-point locking may be overcome by shifting the sampling from its current position. A shift of approximately 180° is the most direct path towards the optimal solution, since saddle-point locking may only occur close to 180° (even though fast phase lock may only achieve 160° in some cases). Additionally and/or alternatively, embodiments discloses herein may be configured to swap I and Q samples. A different phase shift could be applied, enough to get out of the problematic range.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for detecting clock and data recovery loop saddle-point locking in an electronic circuit comprising:
   receiving a signal at a primary clock and data recovery ("CDR") loop associated with the electronic circuit;

processing the signal using at least one of a first order CDR loop and a second order CDR loop included within the primary CDR loop;

determining whether a fast-phase lock module is required, wherein the determining includes determining two transitions in a sampling triplet;

if it is determined that the fast-phase lock module is required, providing a trigger signal to the fast-phase lock module; and receiving the trigger signal at the fast-phase lock module associated with the electronic circuit and performing a fast-phase lock operation on the signal.

2. The method of claim 1, wherein performing the fast-phase lock operation further comprises:

selecting a phase correction direction configured to minimize a clock recovery error, or selecting an arbitrary direction if the clock recovery error is zero; and applying a phase correction in the selected direction.

3. The method of claim 2, further comprising:

reducing a phase correction magnitude prior to selection; and iteratively repeating the steps of selecting, applying, and reducing with the reduced phase correction magnitude.

4. The method of claim 2, wherein the arbitrary direction is selected for a first iteration.

5. The method of claim 3, wherein no phase correction is applied if the clock recovery error is determined to be zero after a first iteration.

6. The method of claim 2, wherein selecting a phase correction direction includes evaluating over one or more samples with respect to their optimal location.

7. The method of claim 3, wherein the phase correction magnitude is scaled by ½ after each iteration.

8. The method of claim 3, wherein an initial phase correction step magnitude is ¼ of a baud unit interval (UI).

9. The method of claim 1, wherein the fast-phase lock operation includes shifting a sampling phase by half of a baud unit interval (UI).

10. The method of claim 9, wherein shifting the sampling phase by half a baud UI is performed by swapping the samples of the CDR taken in a center of an eye with those taken in an edge of the eye, while maintaining a proper ordering of the samples.

11. An apparatus for detecting clock and data recovery loop saddle-point locking in an electronic circuit, comprising:

an integrated circuit (IC) configured to receive a signal at a primary clock and data recovery ("CDR") loop and to process the signal using at least one of a first order CDR loop and a second order CDR loop included within the primary CDR loop, wherein the IC is further configured to determine whether a fast-phase lock module is required, wherein the determining includes determining two transitions in a sampling triplet, if it is determined that the fast-phase lock module is required, the IC is further configured to provide a trigger signal to the fast-phase lock module, the IC is further configured to receive the trigger signal at the fast-phase lock module associated with the electronic circuit and to perform a fast-phase lock operation on the signal.

12. The apparatus of claim 11, wherein the IC is further configured to select a phase correction direction configured to minimize a clock recovery error, or select an arbitrary direction if the clock recovery error is zero, wherein the IC is further configured to apply a phase correction in the selected direction.

13. The apparatus of claim 12, wherein the IC is further configured to reduce a phase correction magnitude prior to selection and iteratively repeating the selecting, applying and reducing with the reduced phase correction magnitude.

14. The apparatus of claim 12, wherein the arbitrary direction is selected for a first iteration.

15. The apparatus of claim 13, wherein no phase correction is applied if the clock recovery error is determined to be zero after a first iteration.

16. The apparatus of claim 12, wherein selecting a phase correction direction includes evaluating over one or more samples with respect to their optimal location.

17. The apparatus of claim 13, wherein the phase correction magnitude is scaled by ½ after each iteration.

18. The apparatus of claim 13, wherein an initial phase correction magnitude is ¼ of a baud unit interval (UI).

19. The apparatus of claim 11, wherein the fast-phase lock operation includes shifting a sampling phase by half of a baud unit interval (UI).

20. The apparatus of claim 19, wherein shifting the sampling phase by half a baud UI is performed by swapping the samples of the CDR taken in a center of an eye with those taken in an edge of an eye, while maintaining a proper ordering of the samples.

* * * * *